(12) United States Patent
Hanano

(10) Patent No.: US 6,961,892 B2
(45) Date of Patent: Nov. 1, 2005

(54) ADDRESS INFORMATION DETECTING APPARATUS AND ADDRESS INFORMATION DETECTING METHOD

(75) Inventor: Masaaki Hanano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 364 days.

(21) Appl. No.: 10/190,363

(22) Filed: Jul. 3, 2002

(65) Prior Publication Data

US 2003/0009720 A1 Jan. 9, 2003

(30) Foreign Application Priority Data

Jul. 4, 2001 (JP) ........................................ 2001-203996

(51) Int. Cl.[7] .............................................. G11C 29/00
(52) U.S. Cl. ........................ 714/769; 714/768; 714/770; 714/805
(58) Field of Search ........................ 714/805, 768–771; 360/48

(56) References Cited

U.S. PATENT DOCUMENTS

| 4,712,141 | A | * | 12/1987 | Tomohisa et al. ........... 358/445 |
| 5,621,743 | A | * | 4/1997 | Tomisawa ................... 714/746 |
| 5,715,021 | A | * | 2/1998 | Gibeau et al. .............. 348/750 |
| 6,243,331 | B1 | * | 6/2001 | Sakamoto et al. ......... 369/30.11 |
| 6,643,228 | B1 | * | 11/2003 | Van Nieuwenhoven .. 369/32.01 |

FOREIGN PATENT DOCUMENTS

| JP | 04-044688 | 2/1992 |
| JP | 11-031365 | 2/1999 |

* cited by examiner

*Primary Examiner*—Albert Decady
*Assistant Examiner*—Steve Nguyen
(74) *Attorney, Agent, or Firm*—David G. Conlin; John J. Penny, Jr.; Edwards & Angell, LLP

(57) ABSTRACT

An address information detecting apparatus in accordance with the present invention is arranged such that a first interpolation address generating section generates a first interpolation address according to a consistent signal supplied from an address comparison section, and a second interpolation address generating section generates a second interpolation address according to an error detection signal supplied from a CRC error detecting section. When a detected address is consistent with at least either of the first and second interpolation addresses and also no error is discovered according to the error detection signal, the detected address is adopted as absolute location information, whereas in situations other than the above, the first interpolation address is adopted as the absolute location information. On this account, even if an address error is misdetected, the malfunction of the apparatus is prevented and proper recording/reproduction can be carried out.

12 Claims, 18 Drawing Sheets

FIG. 5

| ERROR DETECTION SIGNAL | OUTPUT FROM OR CIRCUIT | SELECTED ADDRESS INFORMATION |
|---|---|---|
| 'L' (ERROR-FREE) | 'H' (IN CONSISTENT) | DETECTED ADDRESS |
| 'L' (ERROR-FREE) | 'L' (NOT IN CONSISTENT) | FIRST INTERPOLATION ADDRESS |
| 'H' (ERROR) | 'H' (IN CONSISTENT) | FIRST INTERPOLATION ADDRESS |
| 'H' (ERROR) | 'L' (NOT IN CONSISTENT) | FIRST INTERPOLATION ADDRESS |

FIG. 10

| ERROR DETECTION SIGNAL | CORRECTION DETECTING SIGNAL | 44 OUTPUT FROM OR CIRCUIT | SELECTED ADDRESS INFORMATION |
|---|---|---|---|
| 'L' (ERROR-FREE) | Don't Care | 'H' (IN CONSISTENT) | DECODE ADDRESS |
| 'L' (ERROR-FREE) | Don't Care | 'L' (NOT IN CONSISTENT) | FIRST INTERPOLATION ADDRESS |
| 'H' (ERROR) | 'H' (CORRECTION IS OK) | 'H' (IN CONSISTENT) | DECODE ADDRESS |
| 'H' (ERROR) | 'H' (CORRECTION IS OK) | 'L' (NOT IN CONSISTENT) | FIRST INTERPOLATION ADDRESS |
| 'H' (ERROR) | 'L' (CORRECTION IS NG) | 'H' (IN CONSISTENT) | FIRST INTERPOLATION ADDRESS |
| 'H' (ERROR) | 'L' (CORRECTION IS NG) | 'L' (NOT IN CONSISTENT) | FIRST INTERPOLATION ADDRESS |

ADDRESS INFORMATION DETECTING APPARATUS AND ADDRESS INFORMATION DETECTING METHOD

FIELD OF THE INVENTION

The present invention relates to an address information detecting apparatus and an address information detecting method, with which proper address information can be steadily acquired from recording media such as, for instance, an optical disk, a magneto-optical disk, and a phase change optical disk.

BACKGROUND OF THE INVENTION

Recording media such as an optical disk, a magneto-optical disk, and a phase change optical disk are arranged such that, in data tracks thereon, the address to be absolute location information is recorded in some way. A disk drive unit corresponding to the disks carries out recording/reproduction, etc. in such a way that the address on the data tracks is detected so that the judgment that whether or not the unit reaches a desired location of the tracks is made, and if it is confirmed that the unit reaches the desired location, the disk drive unit starts the operation of recording/reproduction.

As illustrated in FIG. 14, the above-identified disks adopt, for instance, an address recording pattern arranged such that an address area and data are recorded in one sector corresponding to a unit of data to which one address value is assigned. According to this recording pattern, each of the sectors formed on the disk is physically divided into areas so as to store the address information and the data. What are recorded as the address information are an actual address value AD and a CRC error detecting code attached to the same. FIG. 14 exemplifies a recording pattern in which both of the address value AD and the CRC error detecting code are recorded only once. However, these two may be recorded more than once to reduce the address read error.

As FIG. 15 illustrates, an address information detecting apparatus for acquiring address information from the disk using the above-mentioned address recording pattern includes: an address detecting section 101; a CRC error detecting section 102; an address keeping section 103; a selector 104; an address information keeping section 105; an interpolation address generating section 106; and an interpolation address keeping section 107.

The address detecting section 101 is a sort of address decoder for decoding the address information recorded in the disk, and the decoded address information is recorded in a register of the address keeping section 103. The decoded address information is sent to the CRC error detecting section 102 along with the CRC error detecting code, so as to be subjected to the detection (error detection) of an error bit, as the address. The output of the address keeping section 103 and the output of the CRC error detecting section 102 are supplied to the selector 104.

The selector 104 receives an interpolation address from the interpolation address keeping section 107. This interpolation address is generated by interpolating the immediately preceding address information of the selector 104 into the current address information. If the result of the detection in the CRC error detecting section 102 is error-free, the selector 104 selects the address information supplied from the interpolation address keeping section 103 so as to output the same. In contrast, if the result includes an error, the selector 104 outputs the interpolation address supplied from the interpolation address keeping section 107. The output from the selector 104 is supplied to the address information keeping section 105, and as detected address information, the output is supplied to a recording/reproduction operation block, etc. (not illustrated) so as to be utilized for the operation of recording/reproduction.

The address information kept in the address information keeping section 105 is supplied to the interpolation address generating section 106 as well. This interpolation address generating section 106 determines the address of the next sector, and this address is supplied to the interpolation address keeping section 107. The output of the interpolation address keeping section 107 is, as described above, supplied to the selector 104.

By means of the above-mentioned process, it is possible to detect the address information of the disk in which the address value and the error detecting code are recorded in the address area.

A method of recording (i) an address value and (ii) an error correcting code which can correct the error of the address value both in the address area is disclosed by Japanese Laid-Open Patent Publication No. 11-31365/1999 (Tokukaihei 11-31365; published on Feb. 2, 1999).

As a method of recording the address and the error correcting code which can correct the error of the address value both in the address area, as illustrated in FIG. 16, there is a method arranged such that one sector corresponding to a unit of data to which one address value is assigned is physically divided into areas so that the address information and the data are recorded therein. In this method, an actual address AD and an error correcting code ECC attached to this address AD are recorded as the address information. Incidentally, the error correcting code ECC stores a non-binary BCH code and a binary BCH code.

FIG. 17 illustrates an arrangement in which the non-binary BCH code is utilized, as an example of the address information detecting apparatus for acquiring the address information from the disk with the above-mentioned address recording pattern.

In the address information detecting apparatus illustrated in FIG. 17, first of all, address data supplied as a series of 1 bits is converted to parallel data in a serial-parallel conversion section 108. Then the decoded address as parallel data is supplied to (i) a register of an address keeping section 109 and (ii) a syndrome calculation section 110. The syndrome calculation section 110 calculates a syndrome for detecting an error in the supplied address, the result of the calculation is supplied to an address correction section 111 so that the existence of the error is examined, and the result of the examination is supplied to a selector 113. Using the syndrome calculated in the syndrome calculation section 110, the address correction section 111 judges whether or not the error can be corrected, and the result is sent to the selector 113. If the error correction is possible according to the judgment, the error of the address supplied from the address keeping section 109 is corrected.

The selector 113 receives an interpolation address supplied from an interpolation address keeping section 116, in addition to the address information from the address keeping section 109 and the corrected address information from a corrected address keeping section 112. This interpolation address is generated by interpolating the subsequent address information by the current address information supplied from the selector 113, in an interpolation address generating section 115.

If no error is detected by the output from the syndrome calculation section 110, the selector 113 supplies the input data, which is from the address information keeping section 109, to the address information keeping section 105. This input data is supplied as the address information. In contrast, if the error is detected and the correction thereof is judged to be possible according to the input from the address correction section 111, as the address information, the input data from the corrected address keeping section 112 is supplied to the address information keeping section 105. If the error is detected but the correction thereof is judged to be impossible, the interpolation address supplied from the interpolation address keeping section 116 is supplied to the address information keeping section 105, as the address information.

Thanks to the sequences above, it is possible to detect the address information of the disk in which the address value and the error correcting code are recorded in the address area.

However, the conventional address information detecting method described above has the following problems.

That is, the error detection by the conventional address information detecting method is based on the judgment such that the occurrence of the error is acknowledged when a received word is not properly coded.

For instance, as FIG. 18 illustrates, a received word y is constituted by codewords (wi and wj) with a minimum distance of dmin and errors not more than d. y is located inside a small sphere which is centered at wi and has a radius d, and hence if the following equation (1) holds, $$d\min \leq d+1 \qquad (1)$$

there are no other codewords within the radius d. Thus y does not correspond to other codewords so that the occurrence of the error is acknowledged in the receiving end.

In other words, if the number of errors does not satisfy the equation (1), the errors cannot be detected so as to be overlooked.

Now, as FIG. 19 illustrates, assume that a received word y is constituted by codewords (wi and wj) with a minimum distance of dmin and t errors.

In this case, if t satisfies the following equation (2), there are no other codewords inside a small sphere having a radius of t.

$$d\min \geq 2t+1 \qquad (2)$$

Thus, since wi is the codeword most similar to y, y is corrected so that wi substitutes for y.

Also in this case, if the number of errors does not satisfy the equation (2), the errors are not properly corrected so that an improper codeword is used for the substitution.

As described above, the conventional address information detecting method cannot avoid the mis-detection or mis-correction when the number of errors does not satisfy the equations (1) or (2) in the respective case of the error detection or the error correction.

On this account, even if the detection of the address information is carried out with the assistance of the error detecting code and the error correcting code, the mis-detection and mis-correction still occur when a certain number of errors are included. Moreover, even if the error correction is successfully carried out or the result of the detection indicates error-free, the address could be mis-detected so that there is a possibility of malfunction, etc. of the apparatus, provided that the mis-detected address information is carelessly adopted.

In this manner, the mis-detection and mis-correction of the address are unavoidable in the cases of the error detection and the error correction, and hence when the mis-detection or mis-correction of the address occurs, the conventional address information detecting apparatus wrongly adopts the mis-corrected address or the error address which is overlooked, and according to such addresses, the operation of the apparatus is controlled. On this account, the apparatus mis-recognizes the absolute location information on the disk so that the operation of recording/reproduction by the apparatus is not properly carried out, and in the worst case the apparatus malfunctions.

SUMMARY OF THE INVENTION

The objective of the present invention is to provide an address information detecting apparatus and an address information detecting method by which malfunction of a apparatus is prevented and proper recording/reproduction can be carried out, even if an address error is mis-detected or an address is mis-corrected.

To solve the above-mentioned problems, the address information detecting apparatus in accordance with the present invention includes: address information detecting means for detecting address information which includes (i) an address indicating an absolute location on a recording medium and (ii) an error detecting code related to the address; error detecting means for detecting, according to the error detecting code, whether or not a detected address includes an error; first interpolation address generating means for (a) choosing either the detected address or a tentative first interpolation address in accordance with a consistent signal, and (b) outputting the address chosen in (a) as a first interpolation address used for comparison with a following detected address, the consistent signal indicating whether or not the detected address is in consistency with the tentative first interpolation address generated in accordance with either an immediately preceding address or a previous first interpolation address corresponding to the immediately preceding address; second interpolation address generating means for (I) choosing either the detected address or a tentative second interpolation address in accordance with an error detection signal supplied from the error detecting means, and (II) outputting the address chosen in (I) as a second interpolation address used for comparison with the following detected address, the tentative second interpolation address being generated in accordance with either the immediately preceding address or a previous second interpolation address corresponding to the immediately preceding address; and address comparison means for adopting either (1) the detected address as absolute location information when the detected address is in consistency with either the first interpolation address or the second interpolation address and also the error detection signal indicates error-free, or (2) the first interpolation address as the absolute location information in situations other than (1).

According to this arrangement, since the first and second interpolation addresses are generated and these two are compared with the detected address, it is possible to prevent the adoption of incorrect detected address as the absolute location information due to the improper error detection by the error detection means. Moreover, it is possible to prevent a wrong address, which is mis-recognized as error-free by the error detection means, from being adopted as the absolute location information. On this account, the absolute location information can be detected properly.

That is to say, even if the detected address is mis-detected one, the detected address is compared with the first interpolation address so that the appropriateness of the detected address is examined, and hence it is possible to recognize that the detected address includes an error.

Moreover, even if the error detection means misrecognizes a mis-detected address as a proper address, it is possible to judge whether the error detection signal is proper or not, through the comparison of the detected address with the second interpolation address.

On this account, even if the result of the judgment of appropriateness of the detected address and the judgment of the error detection signal are both positive, the detected address is not immediately adopted as the first interpolation address so that after the judgments are confirmed as proper according to the comparison with the first and second interpolation addresses, the detected address is adopted as the absolute location information. If the judgments of the above are improper, the first interpolation address generated according to the immediately preceding address which is error-free is adopted as the absolute location information so that it is possible to always acquire the absolute location information properly.

Thus, according to the address information detecting apparatus in accordance with the present invention, it is possible to prevent the occurrence of malfunction, etc. of the apparatus due to the adoption of a wrong address as the absolute location information.

For a fuller understanding of the nature and advantages of the invention, reference should be made to the ensuing detailed description taken in conjunction with the accompanying drawings.

BRIEF DESCRIPTION OF THE DRAWINGS

FIG. 5 is a drawing describing the output from a selector in the address comparison section shown in FIG. 4.

FIG. 10 is a drawing describing the output from a selector in the address comparison section shown in FIG. 9.

DESCRIPTION OF THE EMBODIMENTS

[Embodiment 1]

The following description will discuss an embodiment in accordance with an address information detecting apparatus and an address information detecting method of the present invention, in reference to FIGS. 1 through 7.

Figure 1:
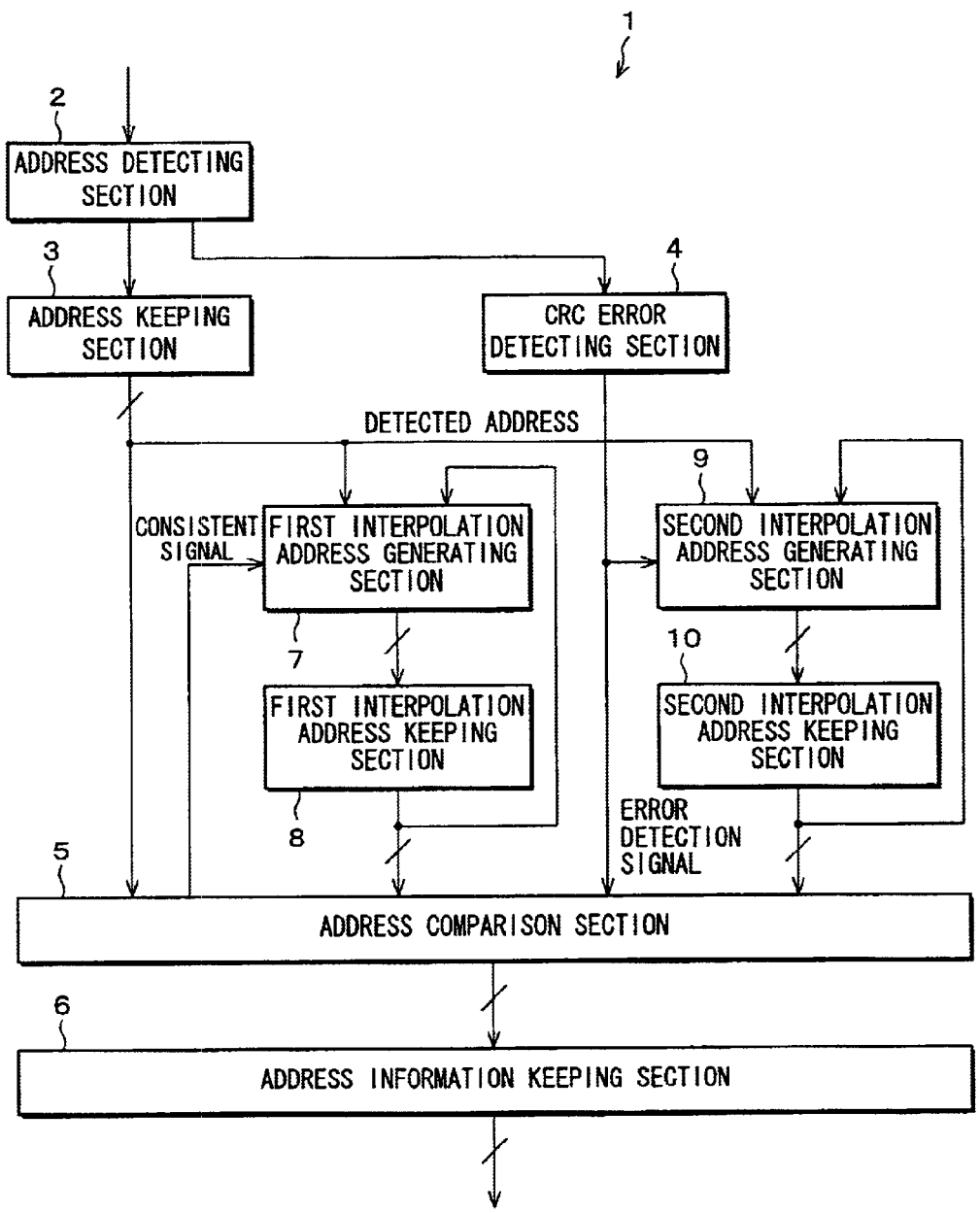
FIG. 1 is a block diagram illustrating a schematic arrangement of an address information detecting apparatus of an embodiment of the present invention.

As FIG. 1 shows, an address information detecting apparatus 1 in accordance with the present invention includes: an address detecting section 2; an address keeping section 3; a CRC error detecting section 4; an address comparison section 5; an address information keeping section 6; first and second interpolation address generating sections 7 and 9; and first and second interpolation address keeping sections 8 and 10.

The address detecting section 2 receives an address signal in the form of serial data, and the address decoded in the address detecting section 2 (hereinafter, will be simply referred to as detected address) is supplied to the address keeping section 3 and the CRC error detecting section 4.

The address keeping section 3 records this detected address so as to send the same to the address comparison section 5, the first interpolation address generating section 7, and the second interpolation address generating section 9.

The CRC error detecting section 4 judges whether or not the detected address includes an error, and to the address comparison section 5 and the second interpolation address generating section 9, the section 4 sends either: an H-level error detection signal if the error is included; or a L-level error detection signal if the error is not included.

The first interpolation address generating section 7 and the second interpolation address generating section 9 generate a first interpolation address and a second interpolation address respectively, in a process described later. The first and second interpolation addresses are supplied to the first interpolation address keeping section 8 and the second interpolation address keeping section 10, respectively.

Then the first interpolation address keeping section 8 supplies the first interpolation address to the address comparison section 5, meanwhile the second interpolation address keeping section 10 supplies the second interpolation address to the address comparison section 5.

In the address comparison section 5, the detected address which has been supplied is compared to the first and second interpolation addresses, and any one of the detected address, the first interpolation address, and the second interpolation address, which is the most appropriate, is supplied to the address information keeping section 6.

The following description discusses a method of detecting an appropriate absolute location information in accordance with the address information detecting apparatus 1 of the present embodiment in detail. First of all, the arrangements of the first and second interpolation address generating sections 7 and 9 are described with the assistance of FIGS. 2 and 3.

Figure 2:
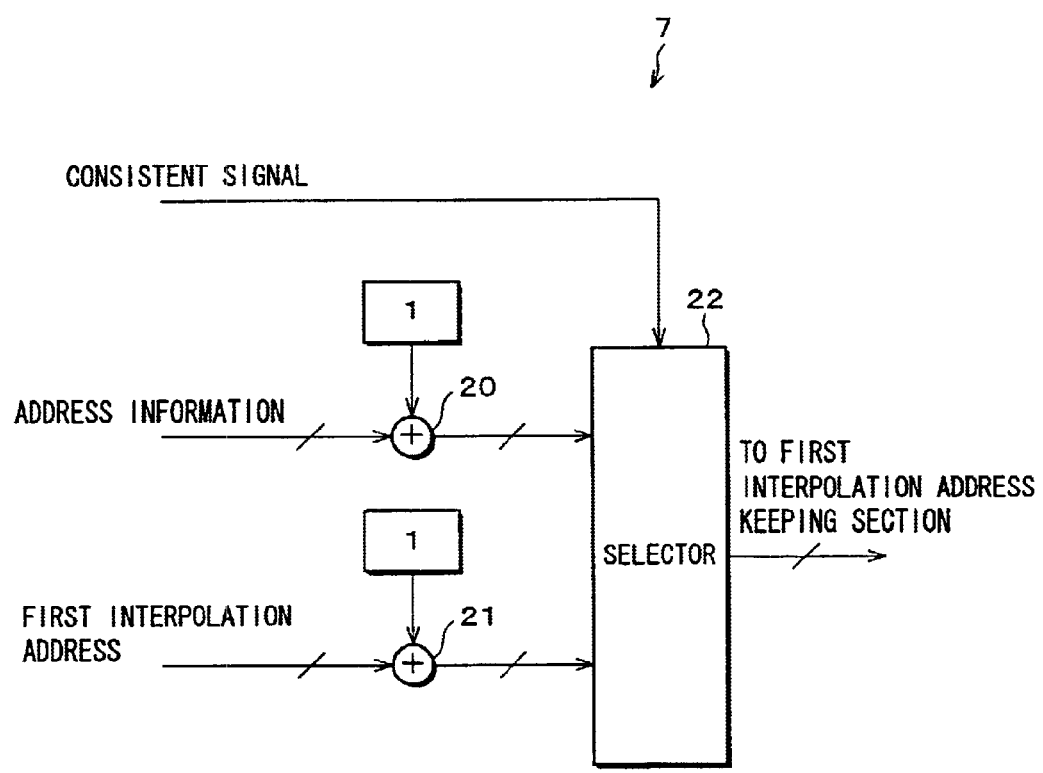
FIG. 2 is a block diagram illustrating a schematic arrangement of a first interpolation address generating section of the address information detecting apparatus shown in FIG. 1.

As illustrated in FIG. 2, the first interpolation address generating section 7 includes adders 20 and 21 and a selector 22.

The adder 20 adds 1 to the detected address so as to interpolate the same. The adder 21 adds 1 to the immediately preceding first interpolation address which is supplied from the first interpolation address keeping section 8, so as to interpolate the address.

The selector 22 determines which address is to be output, in accordance with a consistent signal supplied from the address comparison section 5. That is, when the consistent signal is H-level, i.e. when the detected address is in consistency with either the first interpolation address or the second interpolation address, an address which is interpolated in accordance with the detected address is output as the first interpolation address. In the meantime, when the detected address is in consistency with neither the first interpolation address nor the second interpolation address, an address which is interpolated in accordance with the immediately preceding first interpolation address is selected and this selected address is output as the first interpolation address. The first interpolation address which has been output is recorded in a register of the first interpolation address keeping section 8, and then supplied to the address comparison section 5.

Figure 3:
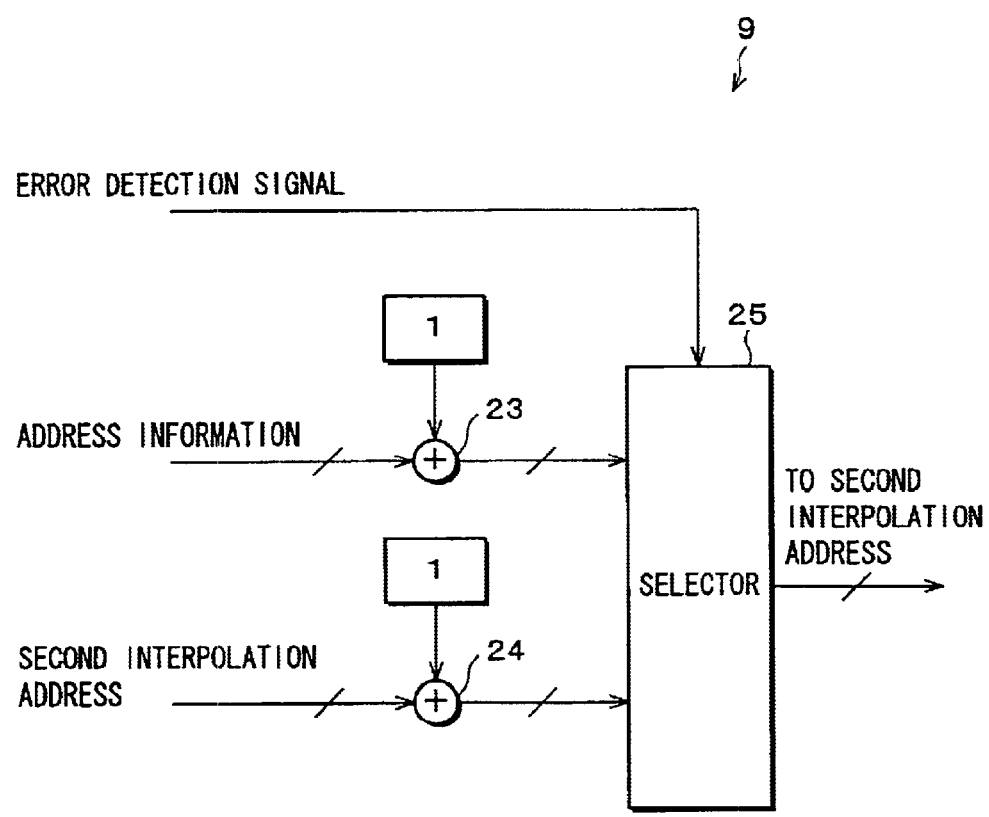
FIG. 3 is a block diagram illustrating a schematic arrangement of a second interpolation address generating section of the address information detecting apparatus shown in FIG. 1.

As illustrated in FIG. 3, the second interpolation address generating section 9 includes, as in the interpolation address generating section 7, adders 23 and 24 and a selector 25.

The adder 23 adds 1 to the detected address so as to interpolate the subsequent address. Similarly, the adder 24 adds 1 to the immediately preceding second interpolation address supplied from the second interpolation address keeping section 10, so as to interpolate the subsequent address.

The selector 25 determines which address is to be output, in accordance with the error detection signal supplied from the CRC error detecting section 4. For instance, when the error detection signal is L-level, i.e. the detected address is error-free according to the judgment, the selector 25 outputs an address, which is interpolated in accordance with the detected address, as the second interpolation address. In the meantime, if the detected address includes an error according to the judgment, the selector 25 selects an address which is interpolated in accordance with the immediately preceding second interpolation address, so as to output this address as the second interpolation address. The second interpolation address which has been output is recorded in a register of the second address keeping section 10, and then supplied to the address comparison section 5.

Figure 4:
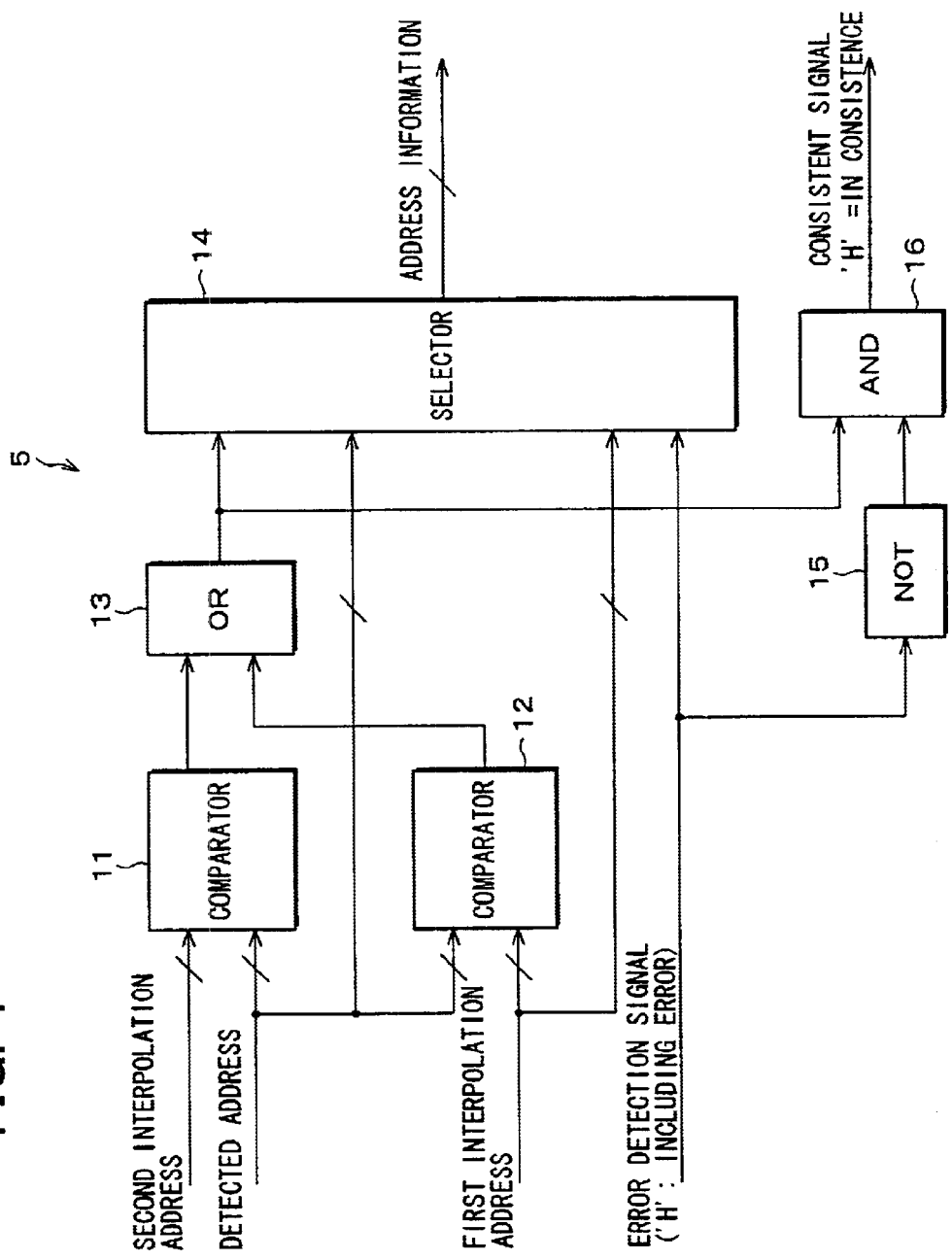
FIG. 4 is a block diagram illustrating a schematic arrangement of an address comparison section of the address information detecting apparatus shown in FIG. 1.
Figure 6:
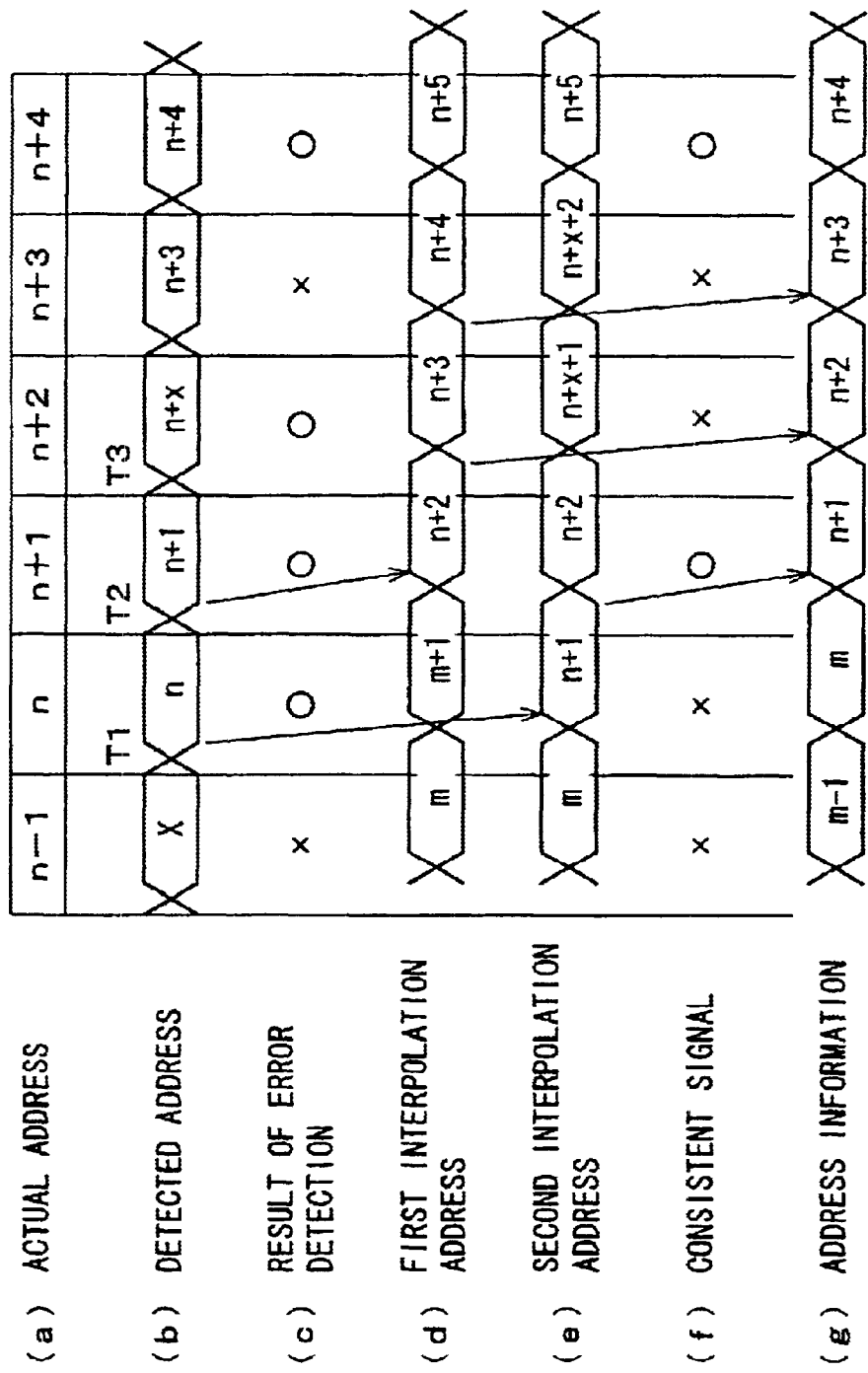
FIGS. 6(a) through 6(g) illustrate an operation model indicating an address information detecting method by using the address information detecting apparatus shown in FIG. 1.
Figure 7:
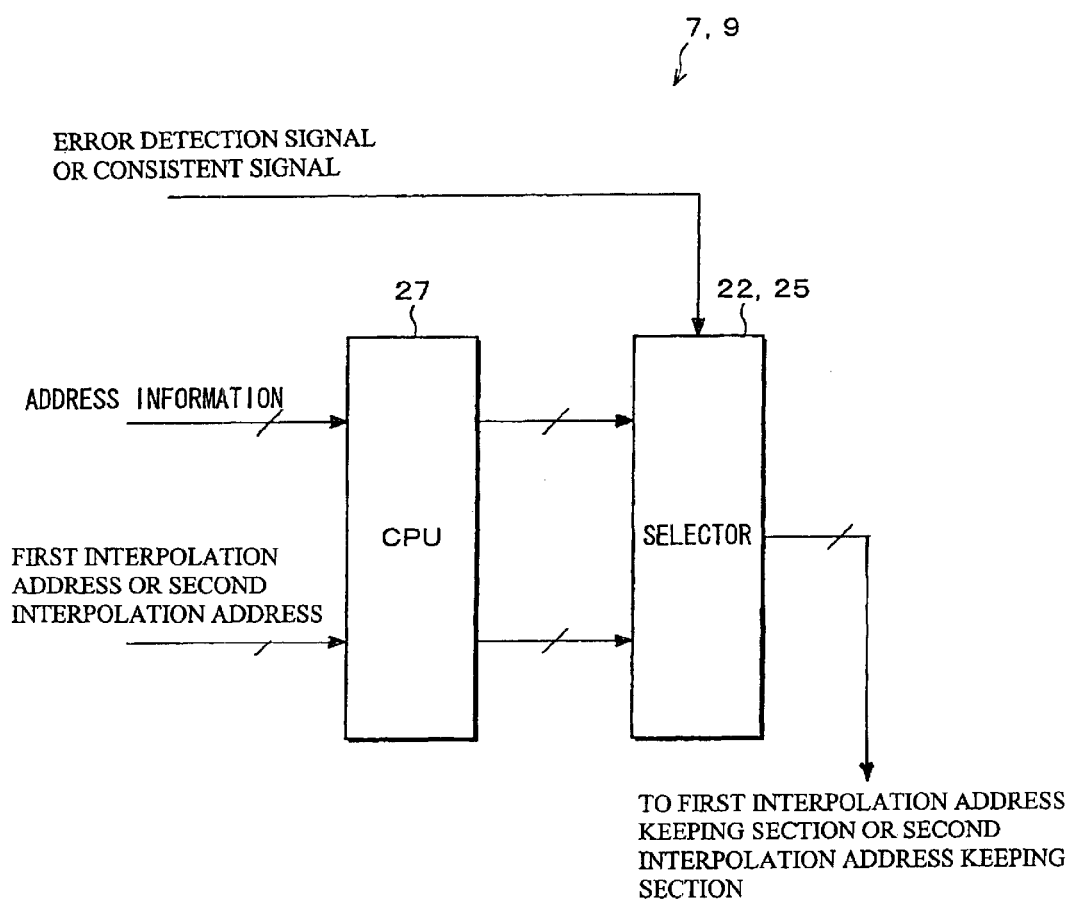
FIG. 7 is a block diagram illustrating an example such that a CPU is adopted instead of adders in the first and second interpolation address generating sections shown in FIGS. 2 and 3 respectively.

Then with the assistance of FIG. 4, the following description minutely discusses the arrangement of the address comparison section 5 which (i) compares the detected address to the first and second interpolation addresses supplied from the first and second interpolation address keeping sections 8 and 10 respectively, so as to (ii) selects an appropriate address.

As illustrated in FIG. 4, the address comparison section 5 includes comparators 11 and 12, an OR circuit 13, a selector 14, a NOT circuit 15, and an AND circuit 16.

The comparator 11 compares the detected address to the immediately preceding second interpolation address, and if these two are in consistency with each other, the comparator 11 sends the H-level signal to the OR circuit 13. Similarly, the comparator 12 compares the detected address to the immediately preceding first interpolation address, and if these two are in consistency with each other, the comparator 12 sends the H-level signal to the OR circuit 13. The selector 14 compares the detected address and the immediately preceding first interpolation address to the error detection signal and the output from the OR circuit 13, so as to select an appropriate address.

As illustrated in FIG. 5, in this selector 14, only when the detected address is error-free and in consistency with at least either of the first and second interpolation addresses, the detected address is selected. In other cases, the first interpolation address is selected.

The error detection signal is reversed in the NOT circuit 15 and then supplied to the AND circuit 16. The AND circuit 16 receives the output from the OR circuit 13, and this signal is then output as the consistent signal. This consistent signal is H-level only when the detected address is error-free and in consistency with at least either of the first and second interpolation addresses.

As described above, the absolute location information selected by the address comparison section 5 is recorded in the address information keeping section 6. This absolute location information is supplied to a control section (not illustrated) for carrying out the operation of recording/reproduction.

The following description specifically discusses the operation of detecting the absolute location information in the address information detecting apparatus 1 which is arranged as above, with the assistance of FIGS. 6(a) through 6(g).

Incidentally, in the present embodiment, it is presumed that after the seeking operation starts, the detected addresses include errors up until a sector n−1, and at T1 in a sector n, an error-free address is detected for the first time, as FIGS. 6(a) through 6(g) illustrate.

The addresses on the disk are indicated as n, n+1, and so on as illustrated in FIG. 6(a), and borders between the addresses correspond to the borders between the sectors.

In the address detecting section 2, a detected address indicated in FIG. 6(b) is detected with respect to an actual address of the disk indicated in FIG. 6(a).

Then the CRC error detecting section 4 judges, as FIG. 6(c) shows, whether or not the detected address includes an error. In FIG. 6(c), ○ signifies that the address is error-free (OK), while × signifies that the address contains an error (NG).

In the first and second interpolation address generating sections 7 and 9, as illustrated in FIGS. 6(d) and 6(e), the first and second interpolation addresses are generated respectively, through the above-mentioned processes.

As FIG. 6(f) indicates, the address comparison section 5 compares the detected address to the first and second interpolation addresses so as to output the consistent signal which indicates the result of the comparison above, and as FIG. 6(g) suggests, the address comparison section 5 selects an appropriate address from the detected address, the first interpolation address, and the second interpolation address, so as to supply the selected address to the address information keeping section 6.

The following description sequentially discusses the operation at each of the moments T1 through T3 in accordance with the respective addresses on the disk, illustrated in FIG. 6(b).

No address is detected before T1 so that the first and second interpolation addresses have an address value m which is completely different from the actual addresses on the disk.

Incidentally, when the result of the detection is (m−1) or (m), the error detection signal is x so that the detected address corresponding to the above is not adopted as the absolute location information, and then the detected address has not been adopted as the information until the error detection signal with ○ is supplied. On this account, the apparatus does not malfunction even when (m−1) or (m) is detected.

At the moment of T1, although the CRC error detecting section 4 makes a judgment that the detected address is error-free, since the first and second interpolation address are (m) whereas the detected address is not (m) but (n), the consistent signal is x (L-level). Thus the address value (m) of the first interpolation address is adopted as the absolute location information.

At this moment, since the constant signal is x (NG) in the first address generating section 7, (m+1) which is the value of the first interpolation address plus 1 is output from the section 7. The error detection signal in the second interpolation address generating section 9 is ○ (OK) so that (n+1) which is the value of the detected address plus 1 is output from the section 9.

At the moment of T2, the detected address is judged as error-free so that the detected address value (n+1) is in consistency with the second interpolation address. Thus the consistent signal is OK (H-level) so that the address comparison section 5 immediately adopts the detected address (n+1) as the absolute location information.

At this moment, the consistent signal is OK in the first interpolation address generating section 7 so that (n+2) which is the value of the detected address plus 1 is generated as the first interpolation address. In the second interpolation address generating section 9, the result of error detection is OK so that (n+2) which is the value of the detected address plus 1 is generated.

At the moment of T3, it is presumed that although the address detected at the moment of T3 should be (n+2), (n+x) is mistakenly detected, and moreover, although the result of error detection should be NG, mis-detection occurs so that the result is OK. In this case, the detected address is in consistency with neither of the first and second interpolation addresses, and hence (n+2) which is the value of the first interpolation address is adopted as the absolute location information by the address comparison section 5 so that mis-detected (n+x) is not adopted as the absolute location information.

At this moment, the consistent signal is x in the first interpolation address generating section 7 so that (n+3) which is the value of the immediately preceding first interpolation address plus 1 is generated. In the meantime, in the second interpolation address generating section 9, the result of error detection is ○ owing to the mis-detection, so that (n+x+1) which is the value of the mis-detected address (n+x) plus 1 is output as the second interpolation address. However, this second interpolation address is not detected as the absolute location information so as not to influence on the operation of the apparatus at all.

After T3, the first interpolation address has been adopted as the absolute location information until a proper address is detected so that the operation is not influenced by the mis-detection of errors. Then when an appropriate address is detected, both the first and second interpolation address keeping sections 8 and 10 keep the address in consistency with the actual address on the disk.

As described above, the address information detecting apparatus 1 in accordance with the present embodiment is arranged such that even if an incorrect address is supplied due to the mis-detection, this address is not adopted as the absolute location information when the address is in consistency with neither of the first and second interpolation addresses generated by the respective first and second interpolation address generating sections 7 and 9. So instead of the mis-detected address, the first interpolation address is adopted as the absolute location information. On this account, the acquired absolute location information is always correct and hence the actual recording/reproduction operation is not affected by the mis-detection, and the malfunction of the apparatus, etc. is prevented.

Moreover, the address information detecting apparatus 1 in accordance with the present embodiment is arranged so that when the result of the error detection of the detected address is ○, the detected address is compared with either the first interpolation address or the second interpolation address so that it is determined whether or not the detected address is in consistency with the first and second interpolation addresses. So the detected address is not adopted as the absolute location information if neither of the first and second interpolation addresses are consistent with the detected address so that the first interpolation address is adopted as the absolute location information. Thus even if the result of error detection of the detected address is O, the detected address is not promptly adopted as the absolute location information, and the absolute location information is determined after the comparison between the detected address and the first and second interpolation addresses. Thus the acquired absolute address information is always correct and hence the troubles such as the malfunction of the apparatus can be prevented.

By the way, although the present embodiment is described with the assistance of the example in which the adders are adopted to work out the first and second interpolation addresses, the present embodiment is not limited to this arrangement. For instance, to work out the first and second interpolation addresses, a processing unit such as a CPU 27 illustrated in FIG. 7 may be adopted instead of the adders 20, 21, 23, and 24 illustrated in FIGS. 2 and 3. This arrangement also makes it possible to carry out precise and speedy address detection, as in the case of the arrangement above.

[Embodiment 2]

The following description will discuss another embodiment in accordance with an address information detecting apparatus and an address information detecting method of the present invention, referring to FIGS. 8 through 13(i). By the way, members having the same functions as those described in embodiment 1 are given the same numbers, so that the descriptions are omitted for the sake of simplicity.

Figure 8:
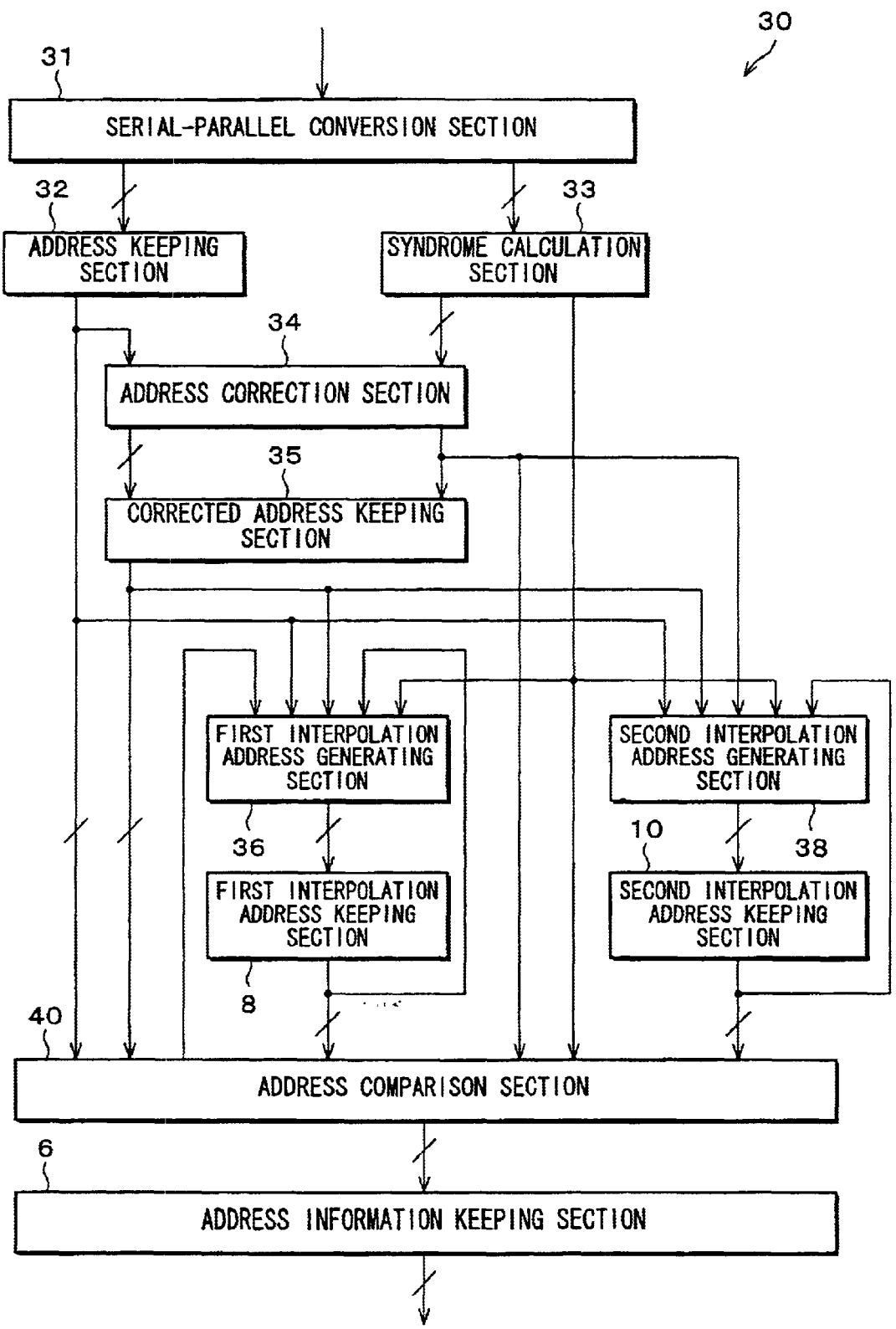
FIG. 8 is a block diagram illustrating a schematic arrangement of an address information detecting apparatus of another embodiment in accordance with the present invention.

As illustrated in FIG. 8, an address information detecting apparatus 30 in accordance with the present embodiment includes: a serial-parallel conversion section 31; an address keeping section 32; a syndrome calculation section 33; an address correction section 34; a corrected address keeping section 35; first and second interpolation address generating sections 36 and 38; first and second interpolation address keeping sections 8 and 10; an address comparison section 40; and an address information keeping section 6.

The serial-parallel conversion section 31 converts the input signal from a serial signal to a parallel signal, so as to output the converted signal to the address keeping section 32 and the syndrome calculation section 33.

The syndrome calculation section 33 carries out a syndrome calculation with respect to the supplied address information to which an address correction code is attached, so as to supply the result of the calculation to the address comparison section 40.

If the address information includes no error, the syndrome (result of the calculation) is zero, whereas if an error is included, the syndrome (result of the calculation) is not zero. Thus whether or not the syndrome is zero determines whether or not the address includes an error or not, and when the syndrome is not zero, the amount and location of the error can be detected.

The address correction section 34 corrects the input address if the address supplied from the address keeping section 32 includes an error, so as to supply the corrected address to the corrected address keeping section 35.

As the first and second interpolation address generating sections 7 and 9 do in embodiment 1, the first and second interpolation address generating sections 36 and 38 generate first and second interpolation addresses respectively. However, the corrected address is generated in the present invention so that the number of input signals is increased, and hence the first interpolation address generating section 36 is further provided with a selector 50 (described later), and the second interpolation address generating section 38 is further provided with a selector 60 (described later), a NOT circuit, and an OR circuit.

The address comparison section 40 receives: a detected address kept in the address keeping section 32; a corrected address which is subjected to the error correction and is the output of the corrected address keeping section 35; an error detection signal which is the output of the syndrome calculation section 33; an error correction detecting signal which is the output of the address correction section 34; the first interpolation address which is the output of the first interpolation address keeping section 8; and the second interpolation address which is the output of the second interpolation address keeping section 10. The address comparison section 40 supplies (i) an address consistent signal to the first interpolation address generating section 36 and (ii) a detected address to the address information keeping section 6.

Figure 9:
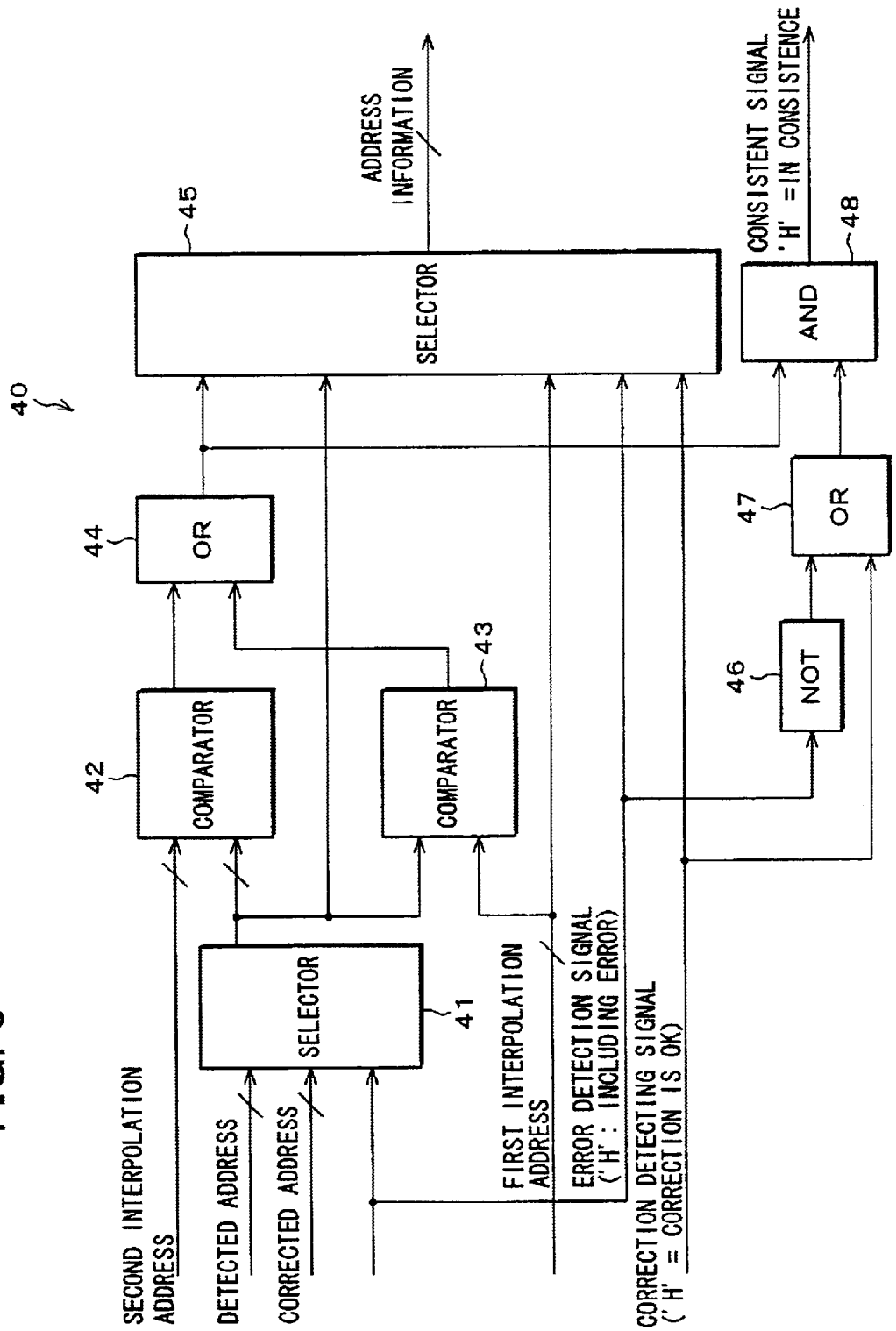
FIG. 9 is a block diagram illustrating a schematic arrangement of an address comparison section of the address information detecting apparatus shown in FIG. 8.

Referring to FIG. 9, the arrangement of the address comparison section 40 is described in detail.

As illustrated in FIG. 9, the address comparison section 40 includes a selector 41, a comparator 42, a comparator 44, an OR circuit 43, a selector 45, a NOT circuit 46, an OR circuit 47, and an AND circuit 48.

The selector 41 selects so as to output the detected address, when the error detection signal is L-level, i.e. when the detected address includes no error. In contrast, when an error is included, the selector 41 outputs the corrected address which is supplied from the corrected address keeping section 35 (hereinafter, the output from the selector 41 will be simply referred to as decode address). The comparator 43 compares the decode address to the first interpolation address, and if these two are in consistency with each other, the comparator 43 supplies an H-level signal to the OR circuit 44.

The selector 45 selects the decode address or the first interpolation address with reference to (i) the error detection signal or (ii) the correction detecting signal, which is the output of the OR circuit 44 and the output of the address correction section 34, being H-level when the correction is OK. Then the address selected above is output.

Moreover, as illustrated in FIG. 10, the selector 45 is arranged such that, in consequence of the error detection, only when: no error is included or the address correction is properly carried out; and the decode address is in consistency with at least either of the first and second interpolation addresses, the decode address is adopted as the absolute location information, and in other cases, the first interpolation address is adopted as the same.

Moreover, after reversed in the NOT circuit 46, the error detection signal is supplied to the OR circuit 47 along with the correction detecting signal. The output of the OR circuit 47 is supplied to the AND circuit 48, and then output as the consistent signal. This consistent signal is H-level only when: the detected address is error-free or the correction is successfully carried out; and the consistent address is in consistency with at least either of the first or second interpolation addresses.

As described above, the absolute location information adopted in the address comparison section 40 is recorded in the address information keeping section 6. This address information is then supplied to a control section (not illustrated) for carrying out the operation of recording/reproduction.

Figure 11:
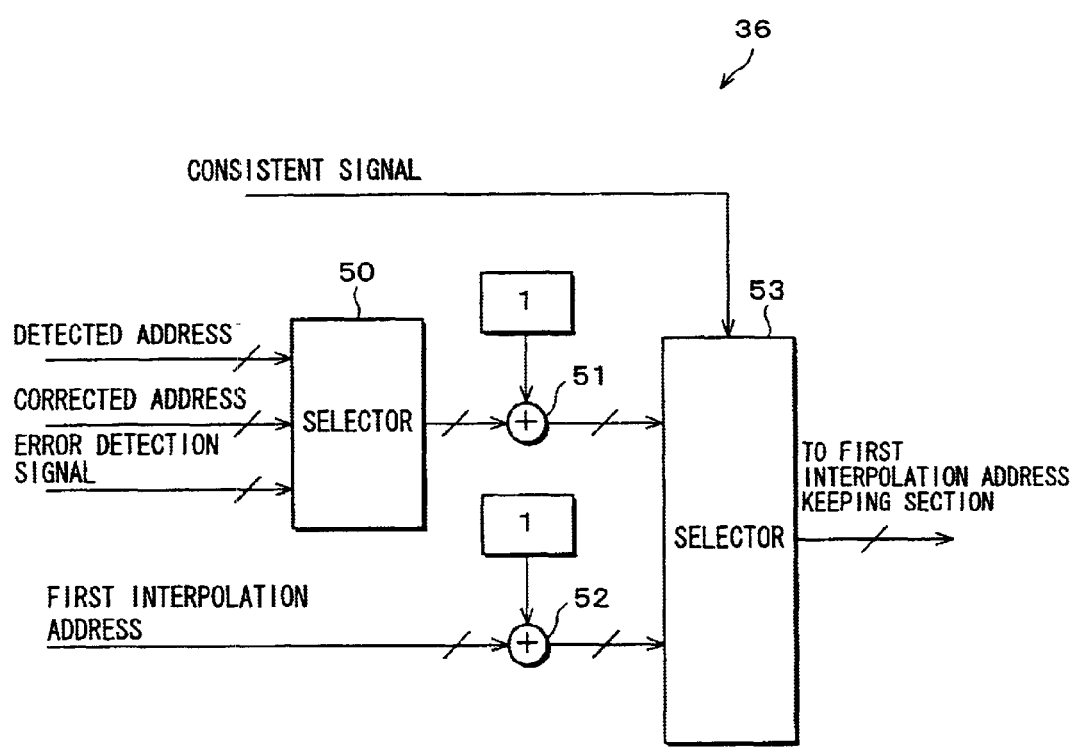
FIG. 11 is a block diagram illustrating a schematic arrangement of a first interpolation address generating section of the address information detecting apparatus shown in FIG. 8.

As illustrated in FIG. 11, the first interpolation address generating section 36 includes a selector 50, adders 51 and 52, and a selector 53.

When the error detection signal is L-level, i.e. when the detected address is error-free, the selector 50 outputs the detected address, and when an error is included therein, the selector 50 outputs the corrected address. The adder 51 adds 1 to the output from the selector 50 so as to carry out the address interpolation. The adder 52 adds 1 to the immediately preceding first interpolation address so as to carry out the address interpolation.

The selector 53 determines which address is to be output, with the assistance of the consistent signal supplied from the address comparison section 40. When the consistent signal is H-level, i.e. either one of the detected address and the corrected address is in consistency with at least either one of the first and second interpolation addresses, the detected address which is interpolated according to the output from the selector 50 is output as the first interpolation address. In contrast, when the corrected address is in consistency with neither one of the first and second interpolation addresses, the immediately preceding first interpolation address is interpolated so as to be output as the first interpolation address.

Figure 12:
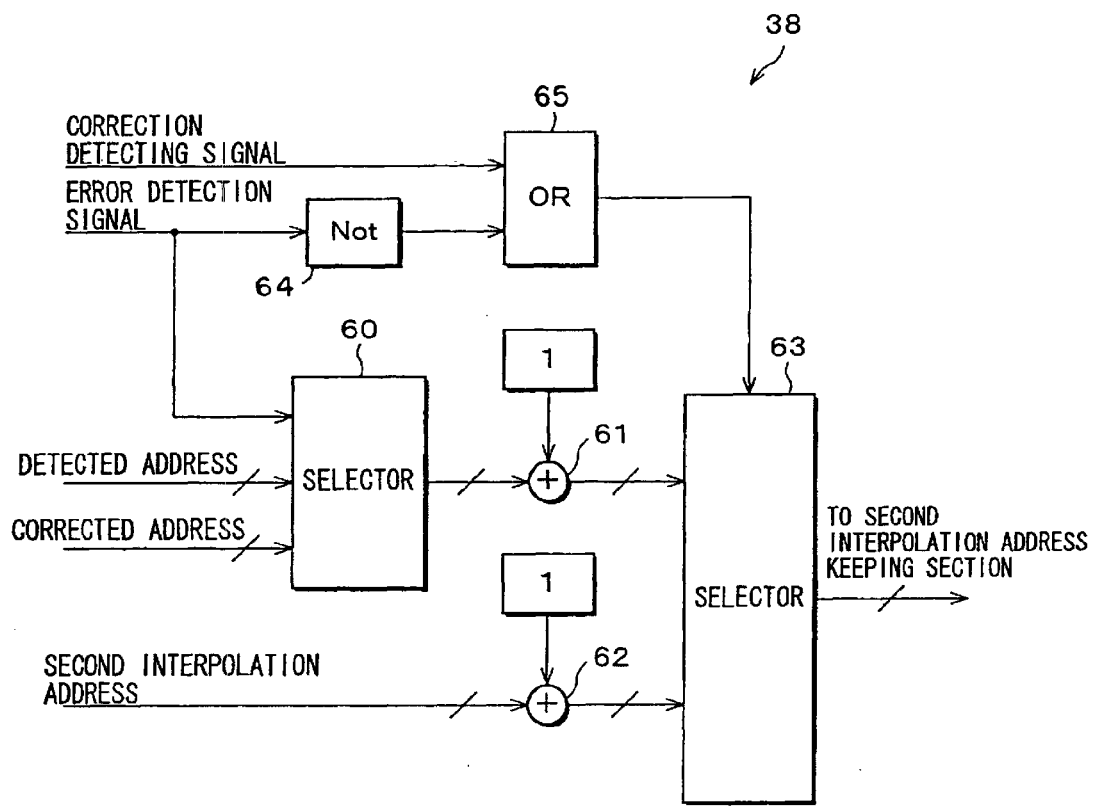
FIG. 12 is a block diagram illustrating a schematic arrangement of a second interpolation address generating section of the address information detecting apparatus shown in FIG. 8.

As illustrated in FIG. 12, the second interpolation address generating section 38 includes a selector 60, adders 61 and 62, a selector 63, a NOT circuit 64, and an OR circuit 65.

When the error detection signal is L-level, i.e. when the detected address is error-free, the selector 60 selects so as to output the detected address, but when an error is included, the corrected address is output. The adder 61 adds 1 to the output from the selector 60 so as to interpolate the following address. Similarly, the adder 62 adds 1 to the immediately preceding second interpolation address so as to interpolate the following address. After reversed in the NOT circuit 64, the error detection signal is supplied to the OR circuit 65 along with the correction detecting signal, and the output of this OR circuit 65 is supplied to the selector 63.

When the signal from the OR circuit 65 is H-level, i.e. when the detected address is error-free or the correction in the address correction section 34 is OK, the selector 63 carries out the interpolation according to the output from the selector 60, so as to output the signal subjected to the interpolation as the second interpolation address. In other cases, the immediately preceding second interpolation address is subjected to the interpolation so as to be output as the second interpolation address.

According to the arrangement above, even if the error detecting information of the address is mis-detected or the address is mis-corrected, the wrong address information is not adopted as the absolute location information, and hence the malfunction, etc. of the apparatus can be prevented.

Figure 13:
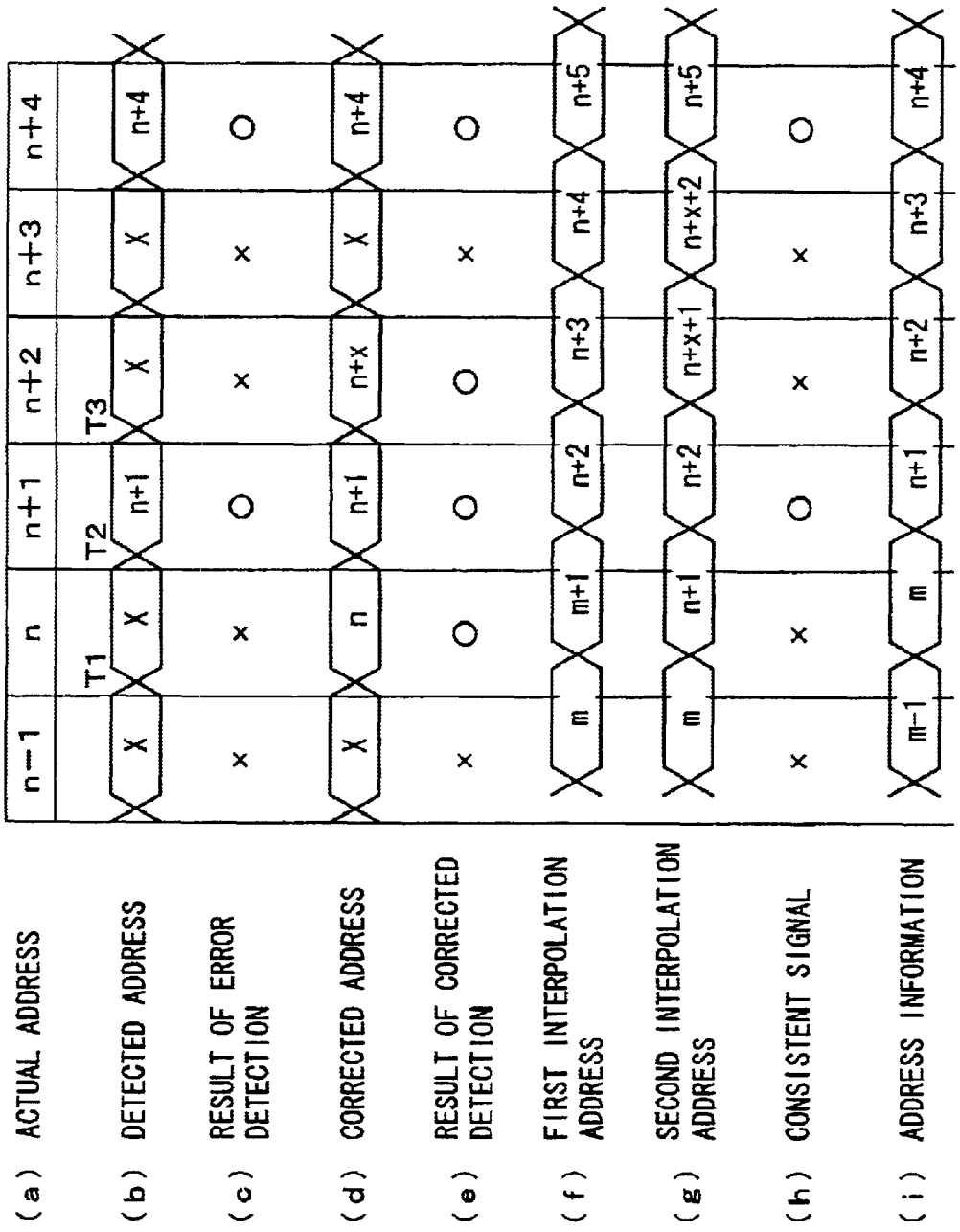
FIGS. 13(a) through 13(i) show an operation model indicating an address information detecting method by using the address information detecting apparatus shown in FIG. 8.
Figure 14:
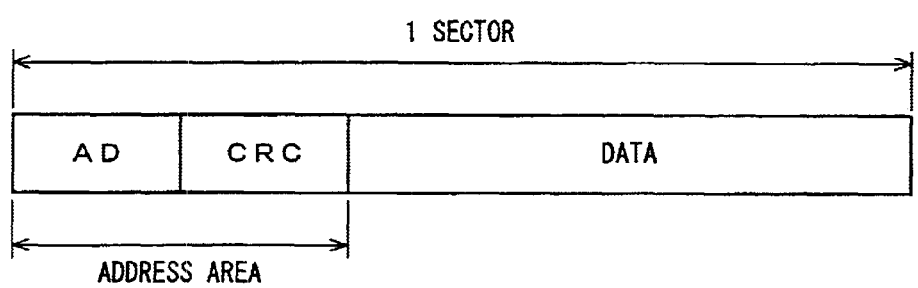
FIG. 14 describes an example of an address recording pattern of a disk.
Figure 15:
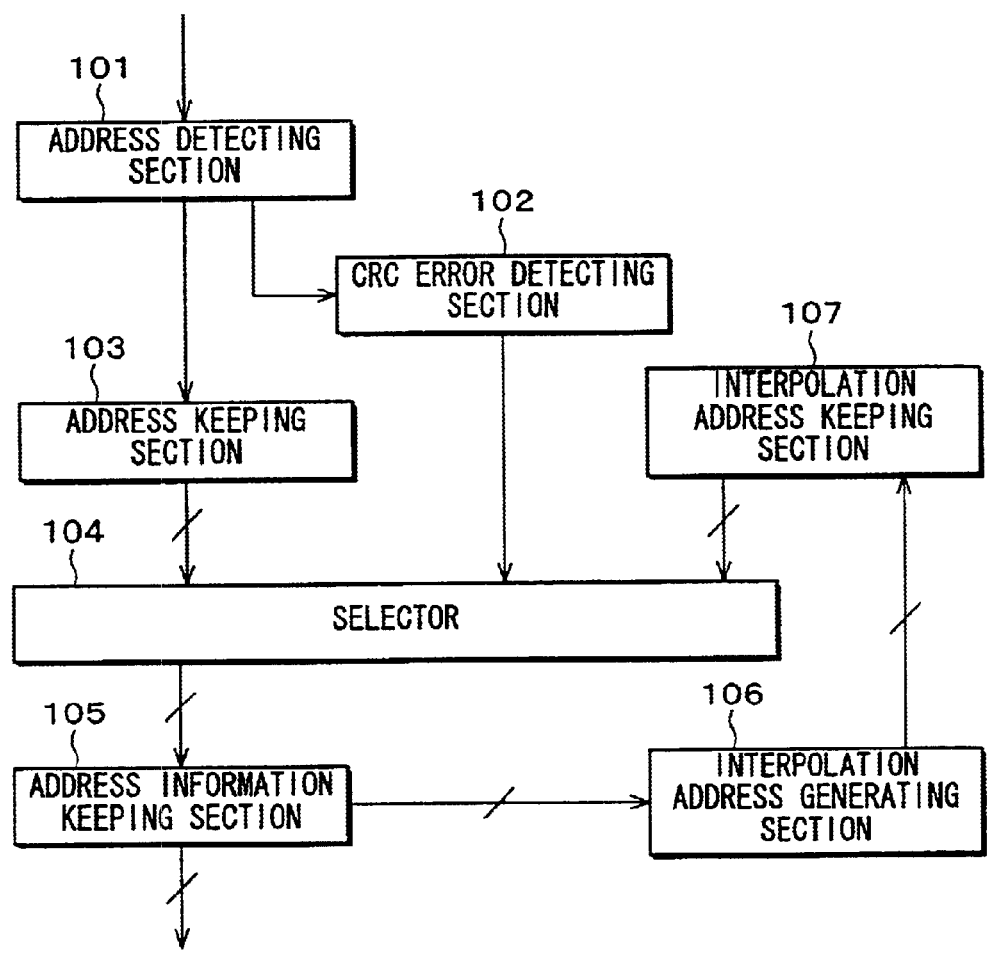
FIG. 15 is a block diagram schematically illustrating an example of a conventional address information detecting apparatus.
Figure 16:
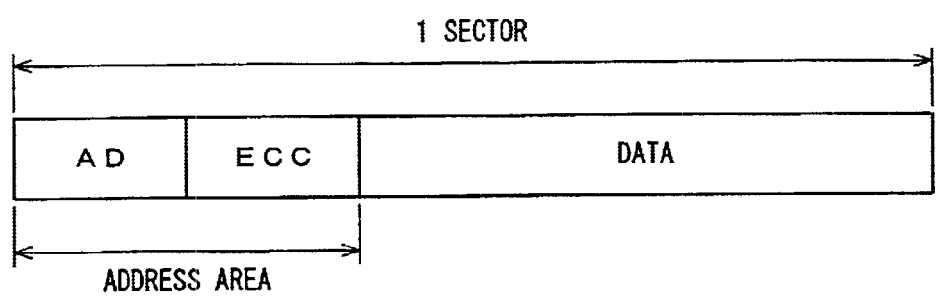
FIG. 16 describes another example of the address recording pattern of the disk.
Figure 17:
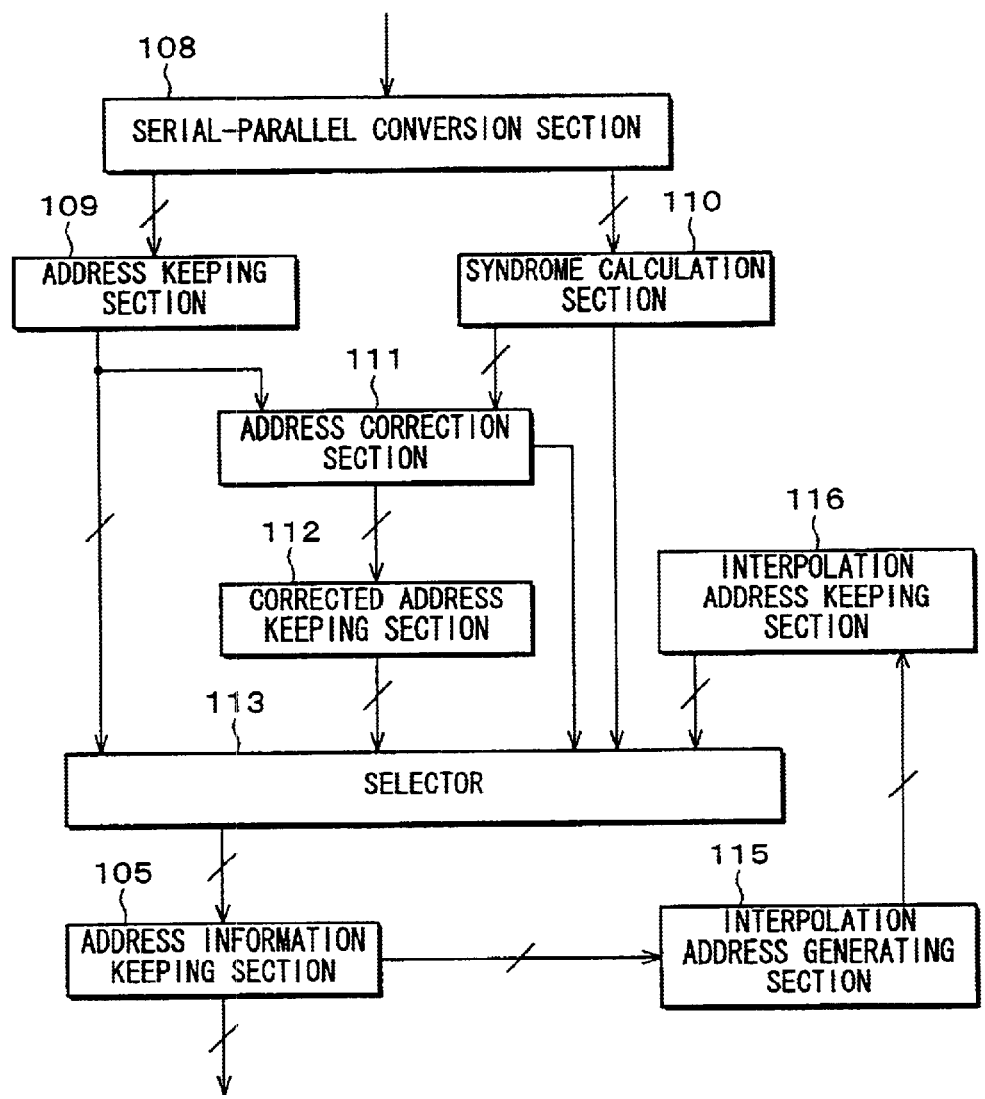
FIG. 17 is a block diagram schematically illustrating another example of the conventional address information detecting apparatus.
Figure 18:
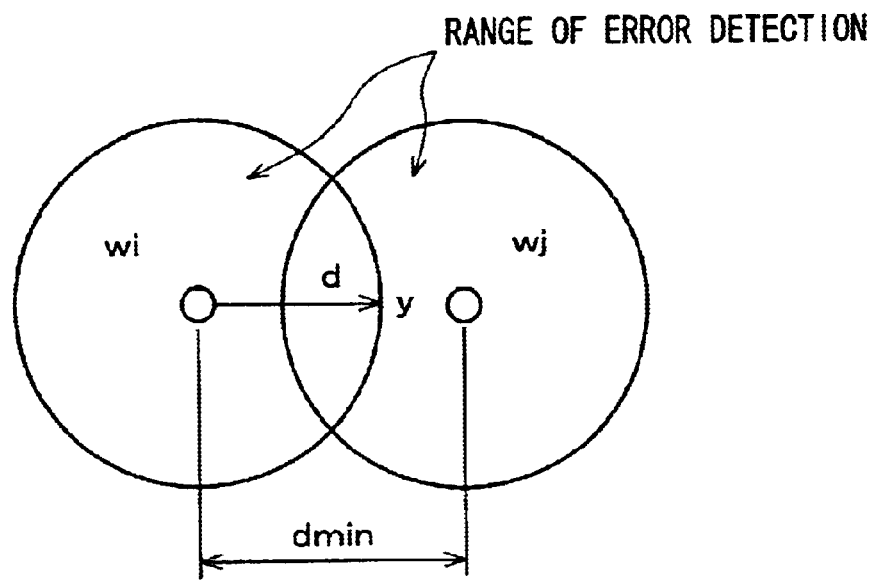
FIG. 18 describes an example of the principle of error detection.
Figure 19:
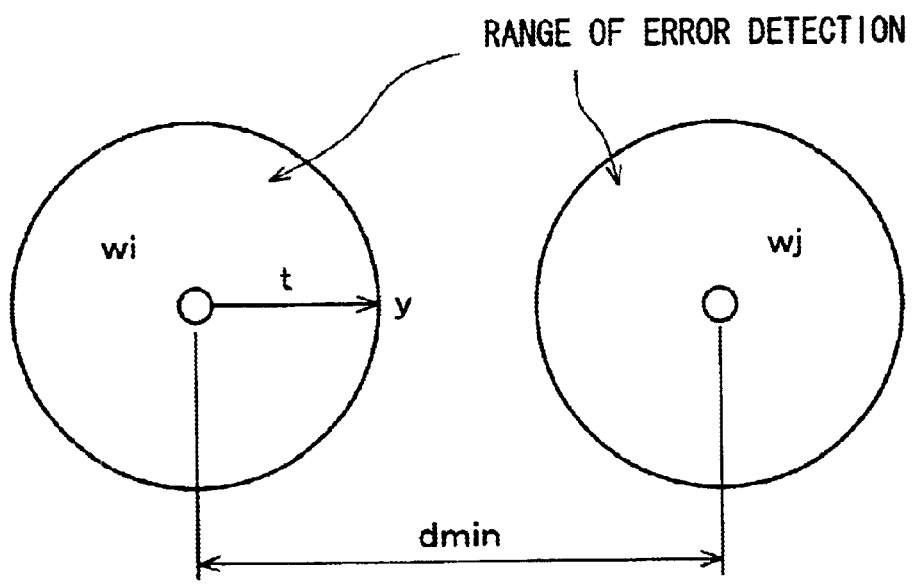
FIG. 19 describes another example of the principle of error detection.

Next, referring to FIG. 13, the operation model of the address information detecting apparatus 30 in accordance with the present embodiment is described as below. n, n+1, and so on in FIG. 13(a) indicate actual addresses on the disk, and the borders between the addresses correspond to the borders between the sectors.

In this arrangement, detected addresses are detected as shown in FIG. 13(b), and the result of error detection of this detected address is either ○ (error-free) or x (error is included) as illustrated in FIG. 13(c).

The address correction section 34 corrects the supplied address as illustrated in FIG. 13(d).

FIG. 13(e) indicates the result of correction in which whether the address correction is OK or not is illustrated.

As indicated in FIGS. 13(f) and 13(g), the first and second interpolation address generating section 36 and 38 generate the first and second interpolation addresses respectively.

As shown in FIG. 13(h), the address comparison section 40 compares the detected address to the first and second interpolation addresses so as to output the consistent signal, and as shown in FIG. 13(i), then the absolute location information is selected so as to supply the same to the address information keeping section 6.

In FIGS. 13(a) through 13(i), after the seeking operation starts, both the detected address and the corrected address are NG up until the sector n−1, then at the moment of T1, the sector n is detected through the error correction. The following description chronologically discusses the operations.

Until after T1, the address has not been detected so that detected address in FIG. 13(b) and the corrected address in FIG. 13(d) both have wrong address values (presumed as x), and also the error detection signal in FIG. 13(c) and the result of correction in FIG. 13(e) are both NG.

The first and second interpolation addresses have respective address values (presumed as m) which are totally different from the addresses on the disk.

Then it is presumed that at the moment of T1, due to the error detection, although the detected address includes an error, this address is corrected in the address correction section 34.

In this case, since the first and second interpolation addresses (m) are different from the corrected address (n), the consistent signal is x (L-level). Thus the address value (m), which is the first interpolation address, is adopted as the absolute location information. In the first interpolation address generating section 36, the consistent signal is NG (x) so that the value of the first interpolation address plus 1 (m+1) is output. In the second interpolation address generating section 38, the result of correction is OK so that the value of the corrected address plus 1 (n+1) is output from the section 38. Since the result of detection is OK, the second interpolation address generating section 38 outputs (n+1) which is the value of the corrected address plus 1.

Then the detected address is error-free at the moment of T2, and the detected address value (n+1) is in consistency with the second interpolation address. Thus the consistent signal is ○ (H-level) so that the address comparison section 40 immediately adopts the detected address (n+1) as the absolute location information.

Since the consistent signal of the first interpolation address generating section 36 is OK (○), the value of the detected address plus 1 (n+2) is generated as the first interpolation address. The result of error detection is OK in the second interpolation address generating section 38 so that the value (n+2) which is the value of the detected address plus 1 is output.

Then at the moment of T3, it is assumed that although the address detected at this moment should be (n+2), the address is mis-corrected to be (n+x) in the address correction section 34.

In this case, since the consistent signal is not in consistency with the interpolation address, the address comparison section 40 adopts the first interpolation address which is (n+2) as the absolute location information. Thus, the mis-detected address is not adopted as the absolute location information so that the malfunction, etc. of the apparatus can be prevented.

In the first interpolation address generating section 36, since the consistent signal is x, (n+3) which is the value of the immediately preceding first interpolation address plus 1 is generated. In the meantime, in the second interpolation address generating section 38, the corrected result of detection is ○ because of the mis-correction, so that (n+x+1) which is the value of the mis-corrected address (n+x) plus 1 is output.

However, even if the wrong address (n+x+1) is output as the second interpolation address, the address adopted as the absolute location information is the first interpolation address so that the actual operation of the apparatus is not affected by the mis-correction at all.

Lastly, at the moment of T3 and after, the first interpolation address has been adopted as the address information until the address is properly detected, so that even if the result of error detection is mis-detected, this does not cause any problem. Then after the moment of proper address detection, the first and second interpolation addresses both keep the addresses in consistency with the addresses on the disk.

As described above, the address information detecting apparatus in accordance with the present embodiment is arranged so that even if (i) the result of error detection of the detected address is mis-detected as error-free or (ii) the address is mistakenly detected as having an error so as to be mis-corrected, the detected address is not adopted as the absolute location information when the address above is not in consistency with either of the first and second interpolation addresses, i.e. when the supplied address is not the interpolation address generated from the preceding address data, so that either of the first and second interpolation addresses is adopted as the absolute location information. On this account, it is always possible to acquire proper absolute location information and the malfunction, etc. of the apparatus can be prevented.

Although the present embodiment is described with the assistance of the arrangement in which the calculations of the first and second addresses are carried out by means of the adders, the present embodiment is not limited to this arrangement. For instance, to work out the first and second interpolation addresses, a processing unit such as a CPU may be adopted instead of the adders 51, 52, 61, and 62 illustrated in FIGS. 11 and 12, as in embodiment 1. This arrangement also makes it possible to carry out precise and speedy address detection, as in the case of embodiment 1.

The address information detecting apparatus in accordance with the present invention may be arranged such that, in a detecting method in which: address information is recorded as an absolute location on the recording medium; the address information includes an address value and a detecting code capable of detecting an error related to the address value; and the address information is detected from the recording medium, when first and second interpolation addresses are worked out according to the previous address information and a tentative address information is judged as error-free according to the error detection at the moment of detecting the tentative address information, this tentative address information is adopted as the address information when the tentative address information is in consistency with at least either of the first and second interpolation addresses, whereas the first interpolation address is adopted as the address information either: when the tentative address information is in consistency with neither of the first and second interpolation addresses; or when the tentative address information includes an error, according to the detection.

Moreover, the address information detecting apparatus in accordance with the present invention may be arranged such that, in a detecting method in which: address information is recorded as an absolute location on the recording medium; the address information includes an address value and an error correcting code capable of correcting an error of the address value; and the address information is detected from the recording medium, when first and second interpolation addresses are worked out according to the previous address information and either (i) a tentative address information is judged as error-free according to the error detection or (ii) an error included in the tentative address information is successfully corrected at the moment of detecting the tentative address information, this tentative address information is adopted as the address information when the tentative address information is in consistency with at least either of the first and second interpolation addresses, whereas the first interpolation address is adopted as the address information either: when the tentative address information is in consistency with neither of the first and second interpolation addresses; or when the error included in the tentative address information is not correctable.

To solve the above-mentioned problems, the address information detecting apparatus in accordance with the present invention includes: address information detecting means for detecting address information which includes (i) an address indicating an absolute location on a recording medium and (ii) an error correcting code related to the address; address correction means for correcting a detected address according to the error correcting code; first interpolation address generating means for (a) choosing either the detected address or a tentative first interpolation address in accordance with a consistent signal and (b) outputting the address chosen in (a) as a first interpolation address used for comparison with a following detected address, the consistent signal indicating whether or not the detected address is in consistency with the tentative first interpolation address generated in accordance with either an immediately preceding address or a previous first interpolation address corresponding to the immediately preceding address; second interpolation address generating means for (I) choosing the detected address or a tentative second interpolation address in accordance with error address correction by the address correction means, and (II) outputting the address chosen in (I) as a second interpolation address used for comparison with the following detected address, the tentative second interpolation address being generated in accordance with either the immediately preceding address or a previous second interpolation address corresponding to the immediately preceding address; and address comparison means for adopting either (1) the detected address as absolute location information either when: the detected address is in consistency with either one of the first and second interpolation addresses and no error is detected according to the error correcting code; or an error is detected according to the error correcting code but a proper correction is carried out by the address correction means, or (2) the first interpolation address as the absolute location information in situations other than (1).

According to this arrangement, since the first and second interpolation addresses are generated and these two are compared with the detected address, even if (i) the error detection according to the error correcting code is not properly carried out, (ii) the detected address is mis-recognized as error-free even though the detected address includes an error, or (iii) an error is detected in the detected address according to the error correcting code but the address correction means fails to carry out proper address correction, it is possible to prevent the mis-detected address with error from being adopted as the absolute location information so that the absolute location information can be detected properly.

That is to say, even if the detected address is mis-detected one, it is possible to recognize that this detected address includes an error, by comparing the detected address with the first interpolation address generated according to the immediately preceding address which is error-free.

Moreover, even if the mis-detected address is mis-recognized as a proper address according to the error correcting code, the comparison of the detected address with the second interpolation address makes it possible to judge whether the result of error detection according to the error correcting code is proper or not.

Furthermore, even if the detected address is judged as including an error according to the error correcting code but the address correction means fails to carry out the correction of the address properly, the mis-corrected address is compared with the second interpolation address and this makes it possible to judge whether the correction is properly carried out or not.

As described above, even if (i) the results of (a) the judgment of appropriateness of the detected address and (b) the error detection according to the error correcting code are both positive or (ii) an error is detected according to the error correcting code so that the address correction means carries out the address correction, the detected address or the corrected address is not immediately adopted as the absolute location information, so that after the confirmation that the judgment or the correction is properly carried out according to the comparison with the first and second interpolation addresses, the detected address or the corrected address is adopted as the absolute location information. If any one of (i) through (iii) is not properly carried out, the first interpolation address generated according to the immediately preceding address which is error-free is adopted as the absolute address information, and hence it is possible to always acquire the absolute location information properly.

On this account, the address information detecting apparatus in accordance with the present invention makes it possible to prevent the malfunction, etc. of the apparatus, which occurs when a wrong address is adopted as the absolute location information.

Moreover, it is preferable that the first and second interpolation addresses are generated by adders.

Because of this, the first and second interpolation addresses can be generated properly and with ease, and for instance, if the first and second interpolation addresses are generated by adding 1 to the precedent addresses, it is easy to compare neighboring addresses.

Moreover, it is further preferable that the first and second interpolation addresses are generated by a processing unit.

On account of this, the adoption of a processing unit such as a CPU makes it possible to generate the first and second interpolation addresses properly and swiftly.

To solve the above-mentioned problems, the address information detecting method in accordance with the present invention includes the steps of: detecting address information which includes (i) an address indicating an absolute location on a recording medium and (ii) a detecting code having an ability of error detection related to the address; generating an error detection signal for detecting, according to the detecting code, whether or not a detected address includes an error; choosing either the detected address or a tentative first interpolation address in accordance with a consistent signal so as to output the address chosen above as a first interpolation address used for comparison with a following detected address, the consistent signal indicating whether or not the detected address is in consistency with the tentative first interpolation address generated in accordance with either an immediately preceding address or a previous first interpolation address corresponding to the immediately preceding address; choosing the detected address or a tentative second interpolation address in accordance with the error detection signal so as to output the address chosen above as a second interpolation address used for comparison with the following detected address, the tentative second interpolation address being generated in accordance with either the immediately preceding address or a previous second interpolation address corresponding to the immediately preceding address; and adopting either (a) the detected address as absolute location information when the detected address is in consistency with either the first interpolation address or the second interpolation address and also no error is detected according to the error detection signal, or (b) the first interpolation address as the absolute location information in situations other than (a).

According to this arrangement, since the first and second interpolation addresses are generated and these addresses are compared with the detected address, it is possible to prevent (i) the adoption of a wrongly detected address, which is owing to improper error detection, as the absolute location information and (ii) the adoption of an address including an error as the absolute location information due to the mis-recognition that the address is error-free, so that the absolute location information can be detected properly.

That is to say, even if the detected address is mis-detected one, the detected address is compared with the first interpolation address for the judgment of appropriateness of the detected address and this makes it possible to recognize that the detected address includes an error.

Moreover, even if the mis-detected address is improperly judged as a proper address, this address is compared with the second interpolation address so that it is possible to judge whether the error detection signal is proper or not.

As described above, even if the results of the judgment of appropriateness of the detected address and the judgment of appropriateness of the error detection signal are both positive, the detected address is not immediately adopted as the absolute location information, so that after the confirmation that the judgments are properly carried out according to the comparison with the first and second interpolation addresses, the detected address is adopted as the absolute location information. If either of the judgments is not properly carried out, the first interpolation address generated according to the immediately preceding address which is error-free is adopted as the absolute address information, and hence it is possible to always acquire the absolute location information properly.

On this account, the address information detecting method in accordance with the present invention makes it possible to prevent the malfunction, etc. of the apparatus, which occurs when a wrong address is adopted as the absolute location information.

To solve the above-mentioned problems, the address information detecting method in accordance with the present invention includes (a) detecting address information which includes (i) an address indicating an absolute location on a recording medium and (ii) an error correcting code having an ability of error correction related to the address; (b) detecting whether or not a detected address includes an error according to the error correcting code; (c) correcting the detected address which includes the error; (d) choosing either the detected address or a tentative first interpolation address in accordance with a consistent signal so as to output the address chosen above as a first interpolation address used for comparison with a following detected address, the consistent address indicating whether or not the detected address is in consistency with the tentative first interpolation address generated in accordance with either an immediately preceding address or a previous first interpolation address corresponding to the immediately preceding address; (e) choosing the detected address or a tentative second interpolation address in accordance with the result of step (b), so as to output the address chosen above as a second interpolation address used for comparison with the following detected address, the tentative second interpolation address being generated in accordance with either the immediately preceding address or a previous second interpolation address corresponding to the immediately preceding address; and (f) adopting either (I) the detected address as absolute location information either when: the detected address is in consistency with either one of the first and second interpolation addresses and no error is detected in the detected address according to the error correcting code; or an error is detected in the detected address according to the error correcting code but the detected address including the error is properly corrected, or (I) the first interpolation address as the absolute location information in situations other than (I).

According to this arrangement, since the first and second interpolation addresses are generated and these two addresses are compared with the detected address, even if (i) the error detection is not properly carried out, (ii) the detected address is mis-recognized as error-free, despite the detected address includes an error, or (iii) although it is recognized that the detected address includes an error, proper address correction is not carried out, the adoption of mis-detected address as the absolute location information is prevented so that the absolute location information is properly detected.

That is to say, even if the detected address is mis-detected one, comparing the same with the first interpolation address generated according to the immediately preceding address which is error-free makes it possible to recognize that the detected address includes an error.

Moreover, even if the detected address including an error is misjudged as a proper address, the detected address is compared with the second interpolation address so that it is possible to judge whether the result of error detection according to the error correcting code is proper or not.

Furthermore, if the detected address is judged as including an error but proper correction thereof is not carried out, it is possible to judge whether or not the correction is properly carried out, by comparing the detected address with the second interpolation address.

As described above, even if (i) the judgment of appropriateness of the detected address and the result of error detection according to the error correcting code are both positive or (ii) an error is detected by the error detection and the address correction is carried out, the detected address or the corrected address is not immediately adopted as the absolute location information, so that after the appropriateness of the above is confirmed according to the comparison with the first and second interpolation addresses, the detected address or the corrected address is adopted as the absolute location information. If either of (i) and (ii) is not properly carried out, the first interpolation address generated according to the immediately preceding address which is error-free is adopted as the absolute location information so that it is possible to always acquire the absolute location information properly.

Thus, according to the address information detecting method in accordance with the present invention, it is possible to prevent the occurrence of malfunction, etc. of the apparatus due to the adoption of a wrong address as the absolute location information.

To solve the above-mentioned problems, the address information detecting apparatus in accordance with the present invention includes: address information detecting means for detecting an address information which includes (i) an address indicating an absolute location on a recording medium and (ii) an error detecting code related to the address; error detecting means for detecting whether or not a detected address includes an error, in accordance with the error detecting code; comparison means for comparing (a) the detected address included in the detected address information with (b) an interpolation address generated according to an address immediately before the detected address; address choosing means for choosing either (I) the detected address as absolute location information when the comparison means detects that the detected address is in consistency with the interpolation address, or (II) the first interpolation address as the absolute location information, at least either when an error is detected according to the error detection code, or when the comparison means detects that the detected address is not in consistency with the interpolation address.

According to this arrangement, since the interpolation address is generated and this address is compared with the detected address, even if (i) the error detection according to the error correcting code is not properly carried out, (ii) although the detected address includes an error, the same is mis-recognized as error-free, or (iii) the detected address is judged as including an error according to the error correcting code but the address correction means fails to carry out proper address correction, it is possible to prevent the address including an error from being adopted as the absolute location information, and hence the absolute location information can be properly detected.

On this account, even if (i) the judgment of appropriateness of the detected address and the result of error detection according to the error correcting code are both positive or (ii) an error is detected by the error detection so that the address correction section carries out the address correction, the detected address or the corrected address is not immediately adopted as the absolute location information, so that after the appropriateness of the above is confirmed according to the comparison with the interpolation address, the detected address or the corrected address is adopted as the absolute location information. If either of (i) and (ii) is not properly carried out, the interpolation address generated according to the immediately preceding address which is error-free is adopted as the absolute location information so that it is possible to always acquire the absolute location information properly.

Thus, according to the address information detecting apparatus in accordance with the present invention, it is possible to prevent the occurrence of malfunction, etc. of the apparatus due to the adoption of a wrong address as the absolute location information.

To solve the above-mentioned problems, the address information detecting method in accordance with the present invention includes the steps of: detecting an address information including (i) an address indicating an absolute location on a recording medium and (ii) an error detecting code related to the address; detecting whether or not the detected address includes an error, according to the error detecting code; comparing (a) the detected address included in the detected address information with (b) an interpolation address generated from an address immediately before the detected address; and adopting either (I) the detected address as absolute location information when the detected address is in consistency with the interpolation address, or (II) the interpolation address as the absolute location information, at least either when the detected address includes an error or when the detected address is not in consistency with the interpolation address.

According to this arrangement, since the interpolation address is generated and this address is compared with the detected address, even if (i) the error detection is not properly carried out, (ii) although the detected address includes an error, the detected address is mis-recognized as error-free, or (iii) although the result of error detection suggests the existence of an error, the address correction is not properly carried out, the address above is not immediately adopted as the absolute location information and proper absolute location information can be detected.

As described above, even if: the judgment of the detected address and the result of the error detection are both positive; or the result of the error detection indicates the existence of an error so that the address correction is carried out, only after the confirmation of appropriateness of the judgments above through the comparison with the interpolation address, the detected address is adopted as the absolute location information. If any one of (i) through (iii) above is found improper, the interpolation address generated according to the immediately preceding address which is error-free is adopted as the absolute location information, and hence it is possible to always acquire the absolute location information properly.

Thus, according to the address information detecting method in accordance with the present invention, it is possible to prevent the occurrence of malfunction, etc. of the apparatus due to the adoption of a wrong address as the absolute location information.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An address information detecting apparatus, comprising:
    address information detecting means for detecting address information which includes (i) an address indicating an absolute location on a recording medium and (ii) an error detecting code related to the address;
    error detecting means for detecting, according to the error detecting code, whether or not a detected address includes an error;
    first interpolation address generating means for (a) choosing either the detected address or a tentative first interpolation address in accordance with a consistent signal, and (b) outputting the address chosen in (a) as a first interpolation address used for comparison with a following detected address, the consistent signal indicating whether or not the detected address is consistent with the tentative first interpolation address generated in accordance with either an immediately preceding address or a previous first interpolation address corresponding to the immediately preceding address;
    second interpolation address generating means for (I) choosing either the detected address or a tentative second interpolation address in accordance with an error detection signal supplied from the error detecting means, and (II) outputting the address chosen in (I) as a second interpolation address used for comparison with the following detected address, the tentative second interpolation address being generated in accordance with either the immediately preceding address or a previous second interpolation address corresponding to the immediately preceding address; and
    address comparison means for adopting either (1) the detected address as absolute location information when the detected address is consistent with either the first interpolation address or the second interpolation address and also the error detection signal indicates error-free, or (2) the first interpolation address as the absolute location information in situations other than (1).

2. An address information detecting apparatus, comprising:
    address information detecting means for detecting address information which includes (i) an address indicating an absolute location on a recording medium and (ii) an error correcting code related to the address;
    address correction means for correcting a detected address according to the error correcting code;
    first interpolation address generating means for (a) choosing either the detected address or a tentative first interpolation address in accordance with a consistent signal and (b) outputting the address chosen in (a) as a first interpolation address used for comparison with a following detected address, the consistent signal indicating whether or not the detected address is consistent with the tentative first interpolation address generated in accordance with either an immediately preceding address or a previous first interpolation address corresponding to the immediately preceding address;
    second interpolation address generating means for (I) choosing the detected address or a tentative second interpolation address in accordance with error address correction by the address correction means, and (II) outputting the address chosen in (I) as a second interpolation address used for comparison with the following detected address, the tentative second interpolation address being generated in accordance with either the immediately preceding address or a previous second interpolation address corresponding to the immediately preceding address; and
    address comparison means for adopting either (1) the detected address as absolute location information either when: the detected address is consistent with either one of the first and second interpolation addresses and no error is detected according to the error correcting code; or an error is detected according to the error correcting code but a proper correction is carried out by the address correction means, or (2) the first interpolation address as the absolute location information in situations other than (1).

3. The address information detecting apparatus as defined in claim 1, wherein the first and second interpolation addresses are generated by adders.

4. The address information detecting apparatus as defined in claim 1, wherein the first and second interpolation addresses are generated by a processing unit.

5. The address information detecting apparatus as defined in claim 2, wherein the first and second interpolation addresses are generated by adders.

6. The address information detecting apparatus as defined in claim 2, wherein the first and second interpolation addresses are generated by a processing unit.

7. An address information detecting method, comprising the steps of:
    detecting address information which includes (i) an address indicating an absolute location on a recording medium and (ii) a detecting code having an ability of error detection related to the address,
    generating an error detection signal for detecting, according to the detecting code, whether or not a detected address includes an error;
    choosing either the detected address or a tentative first interpolation address in accordance with a consistent signal so as to output the address chosen above as a first interpolation address used for comparison with a following detected address, the consistent signal indicating whether or not the detected address is consistent with the tentative first interpolation address generated in accordance with either an immediately preceding address or a previous first interpolation address corresponding to the immediately preceding address;
    choosing the detected address or a tentative second interpolation address in accordance with the error detection signal so as to output the address chosen above as a second interpolation address used for comparison with the following detected address, the tentative second interpolation address being generated in accordance with either the immediately preceding address or a previous second interpolation address corresponding to the immediately preceding address; and adopting either (a) the detected address as absolute location information when the detected address is consistent with either the first interpolation address or the second interpolation address and also no error is detected according to the error detection signal, or (b) the first interpolation address as the absolute location information in situations other than (a).

8. An address information detecting method, comprising the steps of:
   (a) detecting address information which includes (i) an address indicating an absolute location on a recording medium and (ii) an error correcting code having an ability of error correction related to the address;
   (b) detecting whether or not a detected address includes an error according to the error correcting code;
   (c) correcting the detected address which includes the error;
   (d) choosing either the detected address or a tentative first interpolation address in accordance with a consistent signal so as to output the address chosen above as a first interpolation address used for comparison with a following detected address, the consistent signal indicating whether or not the detected address is consistent with the tentative first interpolation address generated in accordance with either an immediately preceding address or a previous first interpolation address corresponding to the immediately preceding address;
   (e) choosing the detected address or a tentative second interpolation address in accordance with the result of step (b), so as to output the address chosen above as a second interpolation address used for comparison with the following detected address, the tentative second interpolation address being generated in accordance with either the immediately preceding address or a previous second interpolation address corresponding to the immediately preceding address; and
   (f) adopting either (I) the detected address as absolute location information either when: the detected address is consistent with either one of the first and second interpolation addresses and no error is detected in the detected address according to the error correcting code; or an error is detected in the detected address according to the error correcting code but the detected address including the error is properly corrected, or (I) the first interpolation address as the absolute location information in situations other than (I).

9. The address information detecting method as defined in claim 7, wherein the first and second interpolation addresses are generated by adders.

10. The address information detecting method as defined in claim 7, wherein the first and second interpolation addresses are generated by a processing unit.

11. The address information detecting method as defined in claim 8, wherein the first and second interpolation addresses are generated by adders.

12. The address information detecting method as defined in claim 8, wherein the first and second interpolation addresses are generated by a processing unit.

* * * * *